United States Patent [19]

Isogai

[11] 4,376,985

[45] Mar. 15, 1983

[54] SEMICONDUCTOR MEMORY DEVICE

[75] Inventor: Hideaki Isogai, Higashikurume, Japan

[73] Assignee: Fujitsu Limited, Kawasaki, Japan

[21] Appl. No.: 179,899

[22] Filed: Aug. 20, 1980

[30] Foreign Application Priority Data

Aug. 23, 1979 [JP] Japan .................................. 54/107393

[51] Int. Cl.³ ....................... G11C 11/40; G11C 13/00
[52] U.S. Cl. .................................................... 365/155
[58] Field of Search ......................... 365/179, 154, 155

[56] References Cited

U.S. PATENT DOCUMENTS 3,764,825 10/1973 Stewart .............................. 365/179

Primary Examiner—Terrell W. Fears
Attorney, Agent, or Firm—Staas & Halsey

[57] ABSTRACT

A semiconductor memory device including memory cells, formed by a pair of multi-emitter transistors each having a collector and a base which are cross connected to each other and arranged in row and column directions, and read-out transistors, each having an emitter which is commonly connected to one of the emitters of the multi-emitter transistors, wherein the read-out transistors are arranged in each column. The multi-emitter transistors and the read out transistors are formed in patterns and the characteristics of both the multi-emitter and read-out transistors have the same variation due to a dispersion of the patterns caused by the manufacturing process.

10 Claims, 6 Drawing Figures

SEMICONDUCTOR MEMORY DEVICE

FIELD OF THE INVENTION

The present invention relates to a semiconductor memory device; more particularly to an improvement in a semiconductor memory device having memory cells formed by a pair of multi-emitter transistors, each having a collector and a base cross-connected to each other, and read-out transistors having emitters connected to one of the emitters of the multi-emitter transistors.

BACKGROUND OF THE INVENTION

With an increase in the memory capacity of a semiconductor memory device, the size of the memory cells forming the semiconductor memory device has a tendency to decrease. When the size of the memory cells is decreased, characteristics of the transistors which form the memory cells are affected by a dispersion of the transistors caused by the manufacturing process. For example, as the width of a window for an electrode, such as an emitter electrode varies, or the size of the window for an electrode varies, due to the manufacturing process, the forward current of the diode between the base and emitter of the transistor varies. If the position of the window for the electrode is not at the correct position, the base resistance of the transistor varies. When the characteristics of the transistors which form the memory cells vary due to the manufacturing process, as mentioned above, sometimes, information stored in the memory cells cannot be read out or, the information may be destroyed.

SUMMARY OF THE INVENTION

An object of the present invention is to provide a semiconductor memory device which is not affected by a variation in the characteristics of the transistors. Another object of the present invention is to provide a semiconductor memory device which avoids a decrease in the margin of circuit operation due to a dispersion of the characteristics of the transistors caused during the manufacturing process.

The above mentioned objects can be achieved by a semiconductor memory device having memory cells, formed by a pair of multi-emitter transistors, each having a collector and a base which are cross-connected to each other are arranged in row and column directions, and read-out transistors having an emitter commonly connected to one of the emitters of the multi-emitter transistors arranged in a row direction. The multi-emitter transistors and the read-out transistors are formed by patterns having the same characteristic variation due to a dispersion of the patterns caused during the manufacturing process.

Further features and advantages of the present invention will be apparent from the ensuing description with reference to the accompanying drawings to which, however, the scope of the invention is in no way limited.

DETAILED DESCRIPTION OF THE PREFERRED EMBODIMENT

Figure 1:
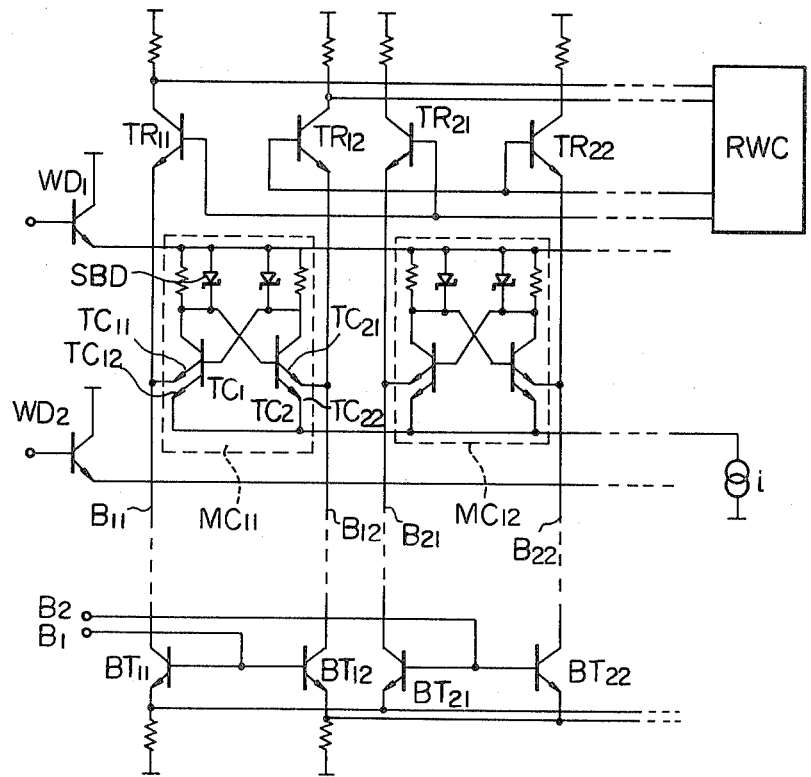
FIG. 1 is a circuit diagram of an example of a conventional semiconductor memory device.

FIG. 1 is a circuit diagram of a conventional semiconductor memory device including a plurality of memory cells $MC_{11}$, $MC_{12}$, . . . arranged in a row direction and a column direction as illustrated in FIG. 1. Referring to FIG. 1, $WD_1$, $WD_2$, . . . denote row selection means for selecting the memory cells $MC_{11}$, $MC_{12}$ . . . arranged in the row direction, and $B_1$, $B_2$, . . . $BT_{11}$, $BT_{12}$ . . . denote column selection means for selecting the memory cells $MC_{11}$, $MC_{12}$ . . . arranged in the column direction. Read-out transistors $TR_{11}$, $TR_{12}$, $TR_{21}$, $TR_{22}$, . . . are provided in each column so as to read out information stored in the memory cells $MC_{11}$, $MC_{12}$ . . . . These read-out transistors $TR_{11}$, $TR_{12}$, $TR_{21}$, $TR_{22}$ . . . are also used for writing information into the memory cells $MC_{11}$, $MC_{12}$ . . . , RWC denotes a read and write circuit. As is well known, the memory cells $MC_{11}$, $MC_{12}$ are formed by multi-emitter transistors $TC_1$ and $TC_2$ which form a flip-flop circuit. Emitters $TC_{12}$, $TC_{22}$ of the multi-emitter transistors $TC_1$ and $TC_2$ are connected to a current source i for holding the information in the memory cells, and emitters $TC_{11}$, $TC_{21}$ of the multi-emitter transistors $TC_1$, $TC_2$ are connected to bit lines $B_{11}$ and $B_{12}$ respectively.

An operation of the circuit illustrated in FIG. 1 is as described below.

If the row selection means $WD_1$ and the column selection means $B_1$ are selected, the memory cell $MC_{11}$ is selected. If the transistor $TC_1$ is in an ON state and the transistor $TC_2$ is in an OFF state, a current which flows from the emitter $TC_{12}$ to the current source i is changed to a current which flows from the emitter $TC_{11}$ to the bit line $B_{11}$. An emitter of the read out transistor $TR_{11}$ is coupled to the emitter $TC_{11}$ of the transistor $TC_1$ and an emitter of the read-out transistor $TR_{12}$ is coupled to the emitter $TC_{21}$ of the transistor $TC_2$ so as to operate as a current switch. Therefore, the current from the emitter $TC_{11}$ of the transistor $TC_1$ flows in the bit line $B_{11}$ and the current from the emitter of the read-out transistor $TR_{12}$ flows in the bit line $B_{12}$. Accordingly, the collector of the read-out transistor $TR_{11}$ is placed at a high potential level and the collector of the read-out transistor $TR_{12}$ is placed at a low potential level, so that the content of the memory cell $MC_{11}$ is read out by the read and write circuit RWC.

In the semiconductor memory device illustrated in FIG. 1, the transistors $TC_1$ and $TC_2$ and the read-out transistors $TR_{11}$ and $TR_{12}$ have emitters which are coupled respectively and operated as a current switch. However, the characteristics of the transistors $TC_1$, $TC_2$ and the read-out transistors $TR_{11}$, $TR_{12}$ vary during the manufacturing process. For example, if the size of the window for an emitter electrode varies during the manufacturing process, the forward current through the base and the emitter of the transistors $TC_1$, $TC_2$, $TR_{11}$, $TR_{12}$ disperses, or if the window for the electrode is not at the correct position, the base resistance or the current amplification factor disperses. If the characteristics of the read-out transistors $TR_{11}$, $TR_{12}$ and the transistors $TC_1$, $TC_2$ in the memory cell $MC_{11}$ are different, it may not always be possible to correctly read out information stored in the memory cells and the information may even be destroyed.

Figure 2:
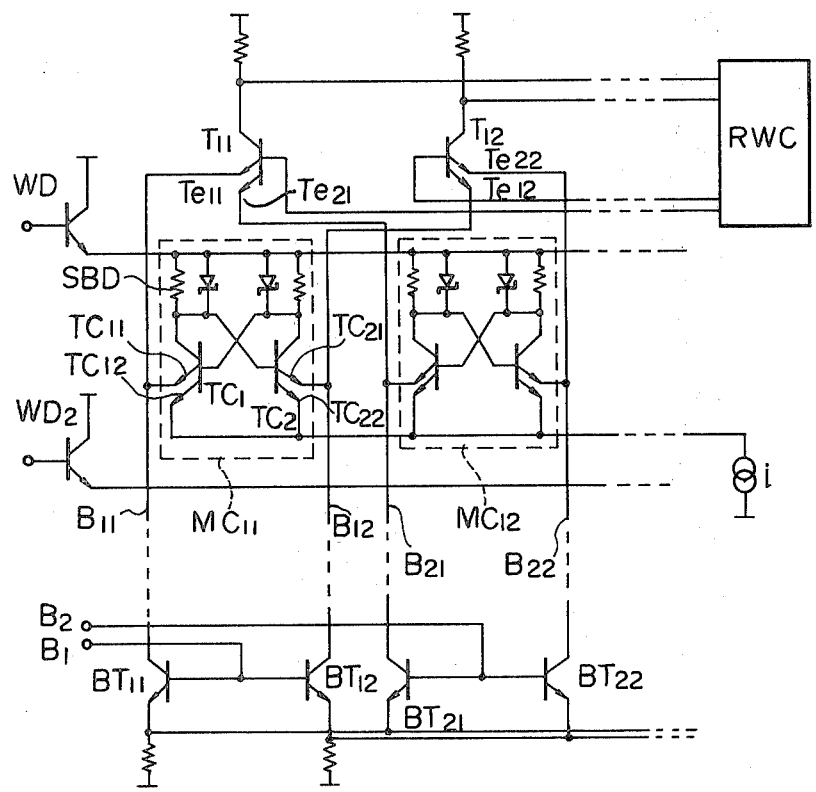
FIG. 2 is a circuit diagram of an embodiment of a semiconductor memory device according to the present invention.

FIG. 2 is a circuit diagram of one embodiment of the semiconductor memory device according to the present invention, and referring to FIG. 2, portions corresponding to portions illustrated in FIG. 1 are designated by the same symbols as those used in FIG. 1.

The circuit illustrated in FIG. 2 is different from the circuit illustrated in FIG. 1, in that the read-out transistors $T_{11}$, $T_{12}$ are formed by a multi-emitter transistors, and the emitters $Te_{11}$, $Te_{12}$ of the read-out transistors $T_{11}$, $T_{12}$, respectively, are connected to the bit lines $B_{11}$ and $B_{12}$, respectively, and the emitters $Te_{12}$, $Te_{22}$ of the read-out transistors $T_{11}$, $T_{12}$, respectively are connected to bit lines $B_{21}$, $B_{22}$, respectively.

In the circuit illustrated in FIG. 2, the read-out transistors $TR_{11}$, $TR_{12}$, $TR_{21}$, $TR_{22}$ illustrated in FIG. 1 are replaced by the multi-emitter transistors $T_{11}$ and $T_{12}$, and therefore, the operation of the circuit illustrated in FIG. 2 is quite similar to the circuit illustrated in FIG. 1. Therefore, the operation of the circuit illustrated in FIG. 2 is omitted herein.

Figure 3A:
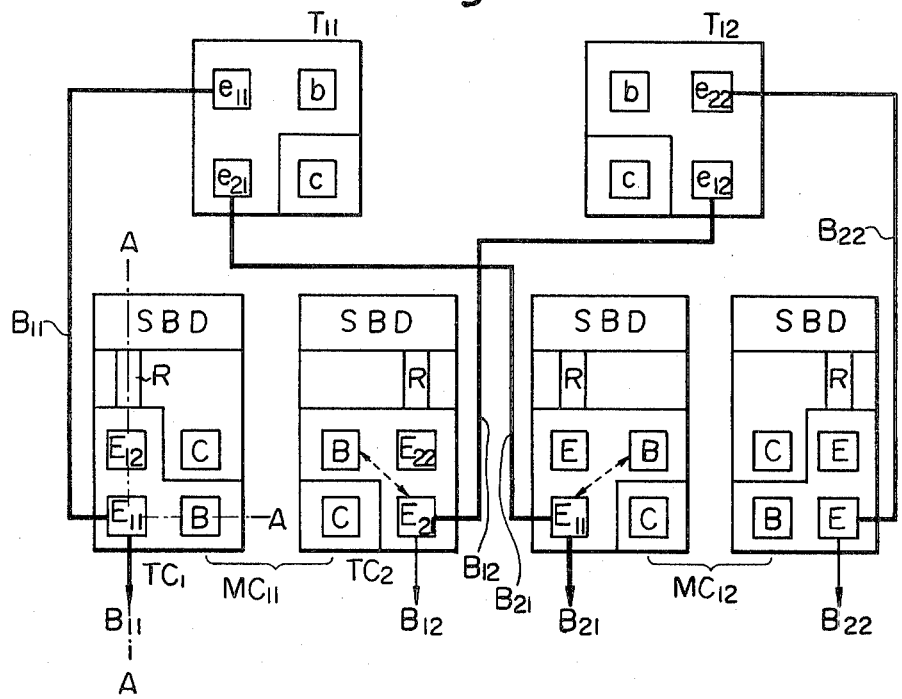
FIGS. 3A and 3B illustrate a plan view of an embodiment of the transistors used in the circuit illustrated in FIG. 2 and a cross-sectional view of an essential portion of the transistors, respectively.
Figure 3B:
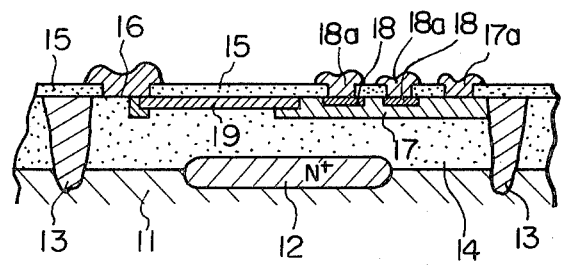

FIG. 3A illustrates a plan view of one embodiment of the transistors used in the circuit illustrated in FIG. 2, and FIG. 3B is a cross-sectional view along line A—A of FIG. 3A. In FIG. 3A, the relationship between the memory cells $MC_{11}$, $MC_{12}$, the read-out transistors $T_{11}$, $T_{12}$ and the bit lines $B_{11}$, $B_{12}$, $B_{21}$, $B_{22}$, are illustrated. Referring to FIG. 3A, $e_{11}$, $e_{21}$, $e_{12}$ and $e_{22}$ in the read-out transistors $T_{11}$ and $T_{12}$ correspond, respectively, to emitters $Te_{11}$, $Te_{21}$, $Te_{12}$, $Te_{22}$ of the transistors $T_{11}$ and $T_{12}$; and b and c in the transistors $T_{11}$ and $T_{12}$ respectively denote a base and collector of the transistors $T_{11}$ and $T_{12}$. The symbols $E_{11}$, $E_{12}$, $E_{21}$ and $E_{22}$ in the memory cell $MC_{11}$ correspond to the emitters $TC_{11}$, $TC_{12}$, $TC_{21}$ and $TC_{22}$ of the transistors $TC_1$, $TC_2$, respectively; and B and C in the memory cell $MC_{11}$ correspond to the base and the collector of the transistors $TC_1$ and $TC_2$ respectively. Further, in FIG. 3A, SBD denotes a Shottky Barrier diode, and R denotes a resistor.

Referring to FIG. 3B, 11 denotes a substrate, 12 denotes a buried layer, 13 denotes an isolation region, 14 denotes a collector region, 15 denotes an insulation layer, 16 denotes a Shottky Barrier diode corresponding to the SBD of FIG. 3A, 17 denotes a base region, 17a denotes a base electrode corresponding to the base B of FIG. 3A, 18 denotes an emitter region, 18a denotes an emitter electrode corresponding to one of the emitters $E_{11}$ or $E_{12}$ of FIG. 3A, and 19 denotes a resistor corresponding to the resistor R of FIG. 3A.

A major advantage of the construction illustrated in FIG. 3A is compensation of the variation of the distance between the base B and the emitter $E_{21}$ in the cell $MC_{11}$ and a variation of the distance between the base B and the emitter $E_{11}$ of the memory cell $MC_{12}$. As can be understood from FIG. 3A, the construction of each of the transistors $TC_1$ and $TC_2$ in the memory cells $MC_{11}$ and $MC_{12}$ is the same as that of one of the read-out transistors $T_{11}$ and $T_{12}$. Therefore, if the position or size of the electrode window varies due to the dispersion caused by the manufacturing process, so that the characteristics of the transistor vary, the construction of the read-out transistors $T_{11}$ and $T_{12}$ becomes equivalent to the construction of the transistors $TC_1$, $TC_2$ which form the memory cells $MC_{11}$ and $MC_{12}$, so that a variation in the characteristics of the transistors can be compensated for. More particularly, the variation in the base resistance, due to the distance between the base and the emitter, of the read-out transistor $T_{11}$, having an emitter $e_{21}$ connected to the bit line $B_{21}$, becomes equivalent to the variation of the base resistance of the transistors in the memory cells, which have emitters commonly connected to the bit line $B_{21}$. Furthermore, the transistors, which have emitters commonly connected to the bit line $B_{12}$, are varied in a similar fashion. Therefore, read out of the information is not disadvantageously affected, and destruction of the information can be prevented.

Figure 4A:
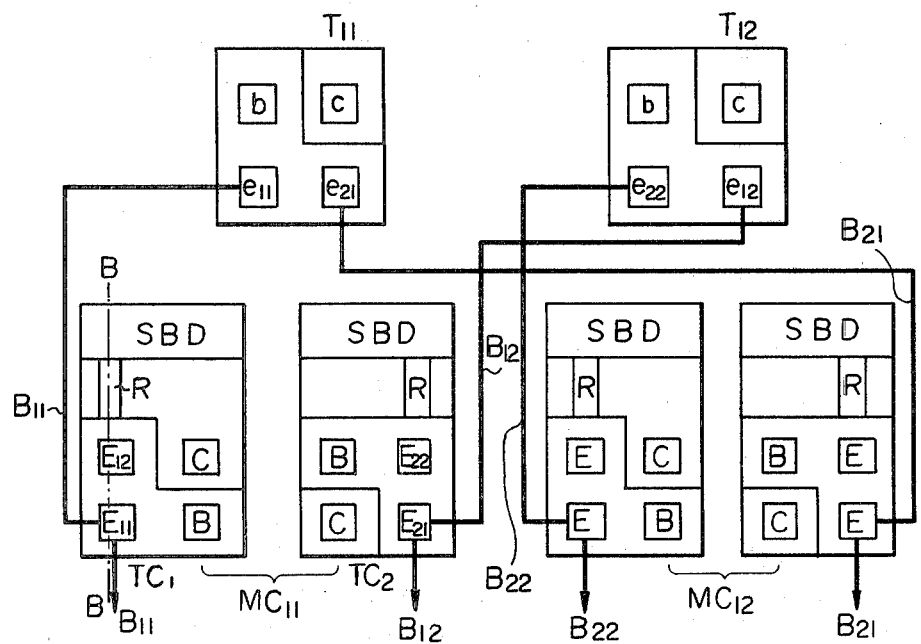
FIGS. 4A and 4B illustrate a plan view of another embodiment of the transistors used in the circuit illustrated in FIG. 2 and a cross-sectional view of an essential portion of the transistors, respectively.
Figure 4B:
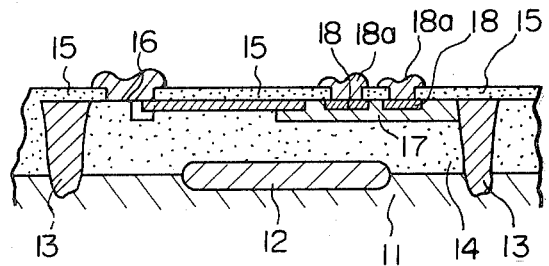

FIG. 4A illustrates a plan view of another embodiment of the transistors used in the circuit illustrated in FIG. 2 and FIG. 4B is a cross-sectional view along line B—B of FIG. 4A. Referring to FIGS. 4A and 4B, portions corresponding to portions illustrated in FIGS. 3A and 3B are designated by the same symbols.

The advantage of the construction illustrated in FIG. 4A is in compensation for the dispersion of the current amplification factor of the transistor due to the position of the emitter near an isolation region. As can be understood from FIG. 4A, the construction of the transistors in the memory cells $MC_{11}$ and $MC_{12}$ are the same as the read-out transistors $T_{11}$ and $T_{12}$. Therefore, if the position of the emitter varies due to the dispersion caused by the manufacturing process, so that the current amplification factor of the transistor varies, the construction of the read-out transistors $T_{11}$ and $T_{12}$ becomes equivalent to the construction of the transistors which form the memory cells $MC_{11}$, $MC_{12}$ . . . having emitters commonly connected to the same bit line as the read-out transistors $T_{11}$ and $T_{12}$, and the variation of the current amplification factor of the transistors can be compensated for. Therefore, read-out of information is not disadvantageously affected, and destruction of the information can be prevented.

As mentioned above, a semiconductor memory device includes a plurality of memory cells arranged in row and column directions, selection means for selecting the row and the column and read-out transistors which are provided in each column for reading out the information stored in the memory cells. According to the features of the present invention, the read-out transistors and the transistors in the memory cells, which have emitters commonly connected to a common bit line, are formed by the same construction. Therefore, if the characteristics of the transistors vary due to the manufacturing process, the characteristics of the transistors in the memory cells can provide the same characteristics as the read-out transistors so that neither a read out nor a storage of the information in the memory cells is adversely affected.

In the embodiment illustrated in FIG. 2, the emitters $Te_{11}$, $Te_{12}$, $Te_{21}$ and $Te_{22}$ of the read-out transistors $T_{11}$ and $T_{12}$ are connected to the column bit lines $B_{11}$, $B_{12}$, $B_{21}$ and $B_{22}$, respectively. However, it is understood that the effect of the present invention can be expected in a case when a transistor having one emitter is used as the read-out transistor, the emitters of which are connected to a column bit line of the memory matrix such as the bit line $B_{11}$, and the multi-emitter transistors are used as the read-out transistors the emitters of which are connected two column bit lines such as the bit lines $B_{12}$ and $B_{21}$.

I claim:

1. A semiconductor memory device comprising:
an isolation region having a plurality of portions;
memory cells, each comprising a pair of multi-emitter transistors each having a collector and a base which are cross-connected to each other and each being surrounded by one of the plurality of portions of said isolation region, said memory cells arranged in row and column directions; and
read-out transistors, each having a base and an emitter which is commonly connected to one of the emitters of said multi-emitter transistors, arranged in each column, each of said read-out transistors being surrounded by one of the plurality of portions of said isolation region, each of said pair of multi-emitter transistors formed such that the relative position of said one of the emitters of said multi-emitter transistor, which is commonly connected to the emitter of one of said read-out transistors, to its base and the isolation region is the same as the relative position of said emitter, of said one of said read-out transistors, to its base and the isolation region, so that the characteristics of both the multi-emitter transistors and the read-out transistors have the same variation.

2. A semiconductor memory device as set forth in claim 1, wherein each of said read-out transistors includes a collector and wherein the relative positions of the isolation region and the emitter regions, base regions and collector regions of said multi-emitter transistors and said read-out transistors are the same, so that the characteristics of said read-out transistors and said multi-emitter transistors are the same.

3. A semiconductor memory device as set forth in claim 1, wherein the distance between said commonly connected one of the emitters and the base of said one of said multi-emitter transistors is the same as the distance between said commonly connected emitter and the base of said one of the read-out transistors.

4. A semiconductor memory device as set forth in claim 1, wherein the distance between the isolation region and said commonly connected one of the emitters of said one of said multi-emitter transistors is the same as the distance between the isolation region and said commonly connected emitter of said one of the read-out transistors.

5. A semiconductor memory device comprising:
an isolation region having first through sixth portions;
first, second, third and fourth bit lines;
a first memory cell operatively connected to said first and second bit lines;
a second memory cell operatively connected to said third and fourth bit lines, said first and second memory cells arranged in a row;
a first read-out transistor having a first emitter operatively connected to said first bit line, having a second emitter operatively connected to said third bit line, having a base and having a collector, said first read-out transistor being surrounded by the first portion of said isolation region; and
a second read-out transistor having a first emitter operatively connected to said second bit line, having a second emitter operatively connected to said fourth bit line, having a base and having a collector, said second read-out transistor being surrounded by the second portion of said isolation region;
said first memory cell comprising first and second multi-emitter transistors each having a collector and a base which are cross-connected to each other, said first multi-emitter transistor surrounded by the third portion of said isolation region and having a first emitter connected to said first bit line, said second multi-emitter transistor surrounded by the fourth portion of said isolation region and having a first emitter connected to said second bit line;
said second memory cell comprising third and fourth multi-emitter transistors each having a collector and a base which are cross-connected to each other and each having an isolation region, said third multi-emitter transistor surrounded by the fifth portion of said isolation region and having a first emitter connected to said third bit line, said fourth multi-emitter transistor surrounded by the sixth portion of said isolation region and having a first emitter connected to said fourth bit line;
said first and second multi-emitter transistors formed such that the relative positions of said isolation region to said first emitter and said base in said first and second multi-emitter transistors are the same as the relative positions of said isolation region to said first emitter and said base in said first and second read-out transistors, respectively, so that the characteristics of said first and second multi-emitter transistors and said first and second read-out transistors, respectively, have the same variation.

6. A semiconductor memory device as set forth in claim 5, further comprising:
column selection means, operatively connected to said first, second, third and fourth bit lines, for selecting the desired bit lines;
row selection means, operatively connected to said first and second memory cells, for selectively accessing said first and second memory cells; and
a read-write circuit operatively connected to the bases of said first and second read-out transistors and to the collectors of said first and second read-out transistors.

7. A semiconductor memory device as set forth in claim 5, wherein the distances between said first emitter and said base in said first and second multi-emitter transistors are the same as the distances between said first emitter and said base in said first and second read-out transistors, respectively.

8. A semiconductor memory device as set forth in claim 7,
wherein each of said first and second multi-emitter transistors has a second emitter,
wherein said first and second emitters, said base and said collector of each of said first and second multi-emitter transistors and said first and second read-out transistors are positioned at the corners of a quadrilateral,
wherein said first emitter is positioned adjacent said base in said first multi-emitter transistor and said first read-out transistor, and
wherein said first emitter is positioned at a diagonal to said base in said second multi-emitter transistor and said second read-out transistor.

9. A semiconductor memory device as set forth in claim 5, wherein the distance between said isolation region and said first emitter in said first and second multi-emitter transistors are the same as the distances between said isolation region and said first emitter in said first and second read-out transistors, respectively.

10. A semiconductor memory device as set forth in claim 9,
wherein each of said first and second multi-emitter transistors has a second emitter;
wherein said first and second emitters, said base and said collector of each of said first and second multi-emitter transistors and said first and second read-out transistors are positioned at the corners of a quadrilateral,
wherein the first and third portions of said isolation region, respectively surrounding said first read-out transistor and said first multi-emitter transistor, are located at the bottom left corner of said quadrilateral, and
wherein the second and fourth portions of said isolation region, respectively surrounding said second read-out transistor and said second multi-emitter transistor, are located at the bottom right corner of said quadrilateral.

* * * * *

UNITED STATES PATENT AND TRADEMARK OFFICE
CERTIFICATE OF CORRECTION

PATENT NO. : 4,376,985
DATED : MARCH 15, 1983
INVENTOR(S) : HIDEAKI ISOGAI.

It is certified that error appears in the above-identified patent and that said Letters Patent is hereby corrected as shown below:

```
Col. 1, line 24, "emitter electrode" should be
        --emitter electrode,--;
        line 49, "other are" should be --other,--.
Col. 3, line 13, delete "formed by a";
        line 17, after "respectively" insert --,--.
Col. 7, [should be single spaced].
```

Signed and Sealed this

Twenty-third Day of August 1983

[SEAL]

Attest:

Attesting Officer

GERALD J. MOSSINGHOFF

Commissioner of Patents and Trademarks